(12) United States Patent
Zipper

(10) Patent No.: US 7,107,027 B2
(45) Date of Patent: Sep. 12, 2006

(54) DISTRIBUTED TRANSMITTER AUTOMATIC GAIN CONTROL

(75) Inventor: Eliav Zipper, Tel-Aviv (IL)

(73) Assignee: Intel Corporation, Santa Clara, CA (US)

( * ) Notice: Subject to any disclaimer, the term of this patent is extended or adjusted under 35 U.S.C. 154(b) by 796 days.

(21) Appl. No.: 09/997,611

(22) Filed: Nov. 29, 2001

(65) Prior Publication Data

US 2003/0100281 A1    May 29, 2003

(51) Int. Cl.
*H04B 1/04* (2006.01)
(52) U.S. Cl. .................. 455/127.2; 455/123; 455/125; 455/136; 455/138
(58) Field of Classification Search ............ 455/234.1, 455/232.1, 219, 123, 125, 250.1, 127.2, 136, 455/138, 127.3
See application file for complete search history.

(56) References Cited

U.S. PATENT DOCUMENTS

| | | | | |
|---|---|---|---|---|
| 5,625,647 A * | 4/1997 | Kawasaki | .................... | 375/295 |
| 6,075,987 A * | 6/2000 | Camp et al. | ................. | 455/427 |
| 6,212,397 B1 * | 4/2001 | Langston et al. | ........... | 455/500 |
| 6,275,684 B1 * | 8/2001 | Kaneko et al. | ............. | 455/118 |
| 6,625,433 B1 * | 9/2003 | Poirier et al. | ............. | 455/232.1 |
| 6,647,072 B1 * | 11/2003 | Shibamura | .................... | 375/297 |
| 6,781,424 B1 * | 8/2004 | Lee et al. | .................... | 327/113 |
| 6,788,744 B1 * | 9/2004 | Hirama | ....................... | 375/297 |

* cited by examiner

*Primary Examiner*—Matthew D. Anderson
*Assistant Examiner*—Tuan Pham
(74) *Attorney, Agent, or Firm*—Schwegman, Lundberg, Woessner & Kluth, P.A.

(57) ABSTRACT

Automatic gain control (AGC) functionality is distributed within a transmitter chain. A controller manages two or more variable gain amplifiers to achieve the desired result.

21 Claims, 3 Drawing Sheets

DISTRIBUTED TRANSMITTER AUTOMATIC GAIN CONTROL

BACKGROUND OF THE INVENTION

In wireless transmitter applications, automatic level control (ALC) is often used to control the output level of the transmitter. Many modern transmitter specifications are requiring a relatively high dynamic range that may be difficult or impossible to achieve using currently available ALC techniques. Therefore, there is a need for methods and structures for implementing ALC within a transmitter that are capable of relatively high dynamic range.

DETAILED DESCRIPTION

Figure 1:
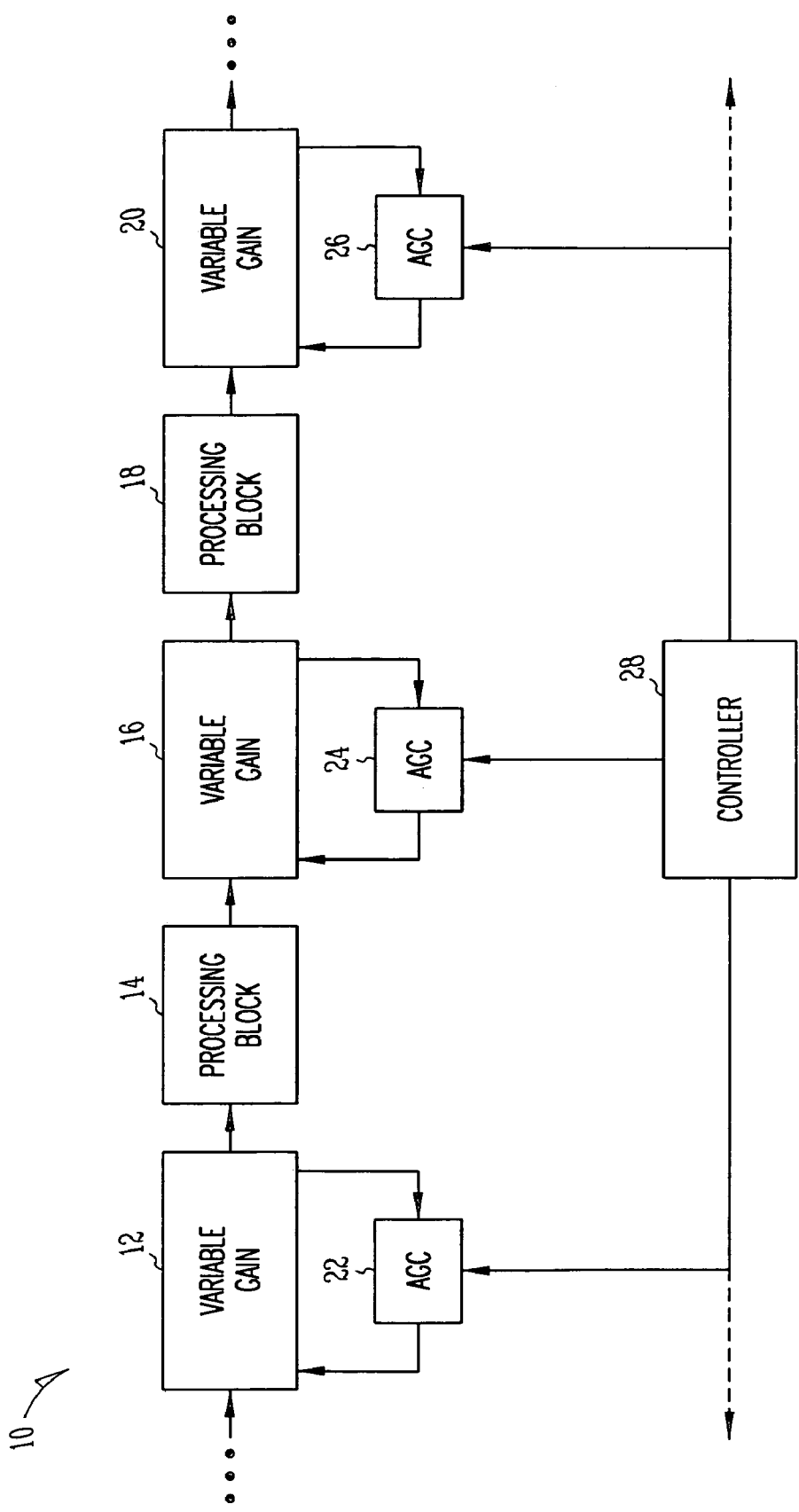
FIG. 1 is a block diagram illustrating a transmitter chain in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to methods and structures for performing automatic level control (ALC) within a transmitter that are capable of supporting a relatively high dynamic range. Instead of using a single feedback loop within a transmitter, the ALC function is distributed amongst multiple loops (e.g., automatic gain control (AGC) loops) throughout the transmitter chain. In this manner, the total dynamic range of the transmitter is not limited by the dynamic range of a single loop (e.g., by the loop detector), but is instead spread out over a number of loops within the transmitter. The inventive principles can be implemented in any of a wide range of transmitter types and are particularly beneficial for use within wireless transmitters. In the wireless area, the inventive principles may be used within, for example, cellular communication systems, satellite communication systems, terrestrial wireless links, two-way radios, wireless local area networks (LANs), metropolitan area networks (MANs), and wide area networks (WANs), as well as a wide variety of other system types. In at least one embodiment, the inventive principles are used to facilitate power control functions within a transmitter (e.g., in a code division multiple access (CDMA) based system). Using the inventive techniques, transmitter dynamic ranges of up to 75 dB or more are believed possible.

FIG. 1 is a block diagram illustrating a transmitter chain 10 in accordance with an embodiment of the present invention. As illustrated, the transmitter chain 10 includes a number of variable gain amplifiers 12, 16, 20 that are each controlled by a corresponding AGC loop 22, 24, 26. The variable gain amplifiers 12, 16, 20 may include any form of device or subsystem that is capable of adjusting the level of a signal by a controlled amount. There are at least two variable gain amplifiers in the chain. Between the variable gain amplifiers 12, 16, 20, there may be optional processing blocks 14, 18 to perform intermediate processing (e.g., modulation, coding, frequency translation, filtration, etc.) of the corresponding signals. A controller 28 is provided to manage the AGC loops 22, 24, 26 in a manner that is designed to achieve a desired result at the output of the transmitter. It should be appreciated that the individual blocks illustrated in FIG. 1 are functional in nature and do not necessarily represent discrete hardware elements. For example, one or more of the blocks (or portions thereof) may be implemented in software within a single (or multiple) digital processing units in the transmitter. This may include, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, as well as combinations of the above.

As described above, the controller 28 is operative for managing the AGC loops 22, 24, 26 in manner that is designed to achieve a desired result at the output of the transmitter. This result may include, for example, the generation of a desired transmit power level at the transmitter output. Another possible result may be to achieve a desired level change at the output of the transmitter (e.g., a 0.5 dB increase or decrease in transmit power). Based on the result that is desired, the controller 28 may determine settings for the AGC loops 22, 24, 26 that will achieve the desired result. For example, in one approach, the controller 28 may determine desired gains for each of the variable gain amplifiers 12, 16, 20 in the chain that will achieve a desired transmit power. The controller 28 will then communicate these gains to the corresponding AGC loops 22, 24, 26 and the loops will adjust the associated variable gain amplifiers 12, 16, 20 accordingly. In one approach, the controller 28 determines the required gains based on the additive nature of the gains along the chain. The controller 28 will preferably be programmed in a manner that achieves an enhanced dynamic range for the transmitter. That is, the controller 28 should attempt to avoid gain scenarios in the chain that can result in dynamic range limiting signal levels at one or more of the AGC loop detectors in the system. Each of the AGC loops 22, 24, 26 in the transmitter chain 10 uses feedback techniques to adjust a corresponding variable gain amplifier 12, 16, 20. Typically, this will involve sensing a gain associated with the corresponding variable gain amplifier and adjusting a parameter (e.g., a voltage level) of a gain control signal of the variable gain amplifier based thereon. In a direct approach, the actual output signal level of the variable gain amplifier may be sensed and used to adjust the corresponding gain control signal. In another possible technique, a pilot signal having a different frequency than the normal signal propagating through the chain is applied to the input of the variable gain amplifier in addition to the normal signal. The amplified pilot signal is then sensed at the output of the variable gain amplifier and is used to adjust the gain control signal of the amplifier. The pilot signal may be a continuous wave (CW) signal (having no amplitude modulation) to prevent the occurrence of fluctuations in the AGC control signal that might translate to the signal propagating through the chain.

Figure 2:
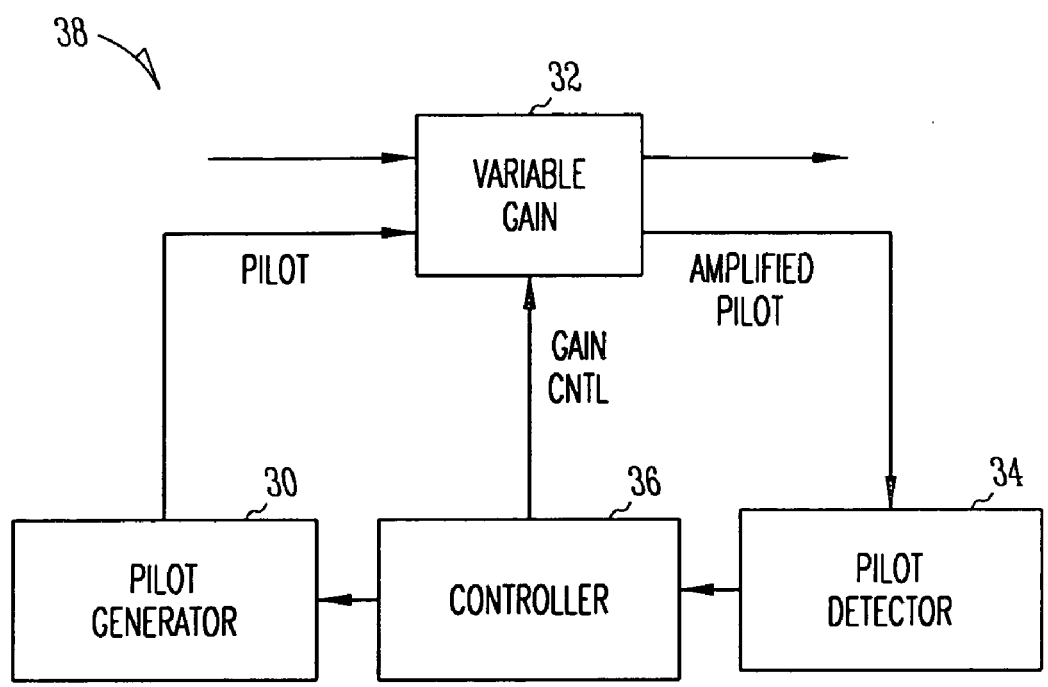
FIG. 2 is a block diagram illustrating a pilot based AGC arrangement that may be used in accordance with the present invention.

FIG. 2 is a block diagram illustrating a pilot based AGC arrangement 38 that may be used in accordance with the present invention. As shown, a pilot generator 30 generates a pilot signal that is input into a variable gain amplifier 32 (along with the normal signal). The variable gain amplifier 32 amplifies the pilot signal and outputs the amplified signal at an output. Because the pilot is a different frequency from the normal signal being processed by the variable gain amplifier 32, it is easily separated therefrom. A pilot detector 34 detects the level of the amplified pilot signal and delivers the level information to a gain controller 36. The gain controller 36 then uses this level information, among other things, to adjust the gain of the variable gain unit 32 until a desired gain has been achieved. The pilot signal may alternatively be derived from other internal sources.

In still another possible AGC technique, a duplicate circuit may be used to adjust the gain of a variable gain amplifier. The duplicate circuit should be designed to mimic the performance of the actual variable gain amplifier under the same operational conditions (e.g., temperature, supply voltage, etc.). The duplicate circuit may be, for example, an identical circuit to the corresponding variable gain amplifier. A signal is applied to the input of the duplicate circuit and the gain of the duplicate circuit is adjusted until a desired gain or output level is achieved. The resulting gain control signal of the duplicate is then used to control the gain of the corresponding variable gain amplifier in the chain. Other AGC techniques may also be used in accordance with the invention.

Referring back to FIG. 1, to reduce power consumption in the transmitter chain 10, one or more of the AGC loops 22, 24, 26 may be deactivated (either fully or partially) during periods of non-use. For example, the controller 28 may include functionality for turning off one or more (or all) of the AGC loops 22, 24, 26 when adjustments are not being made. In the pilot based AGC loop of FIG. 2, for example, the controller 28 may deactivate the pilot generator 30, the pilot detector 34, and/or the gain controller 36 during periods when adjustments are not being made. Similarly, when a duplicate circuit is being used, the controller 28 may deactivate the duplicate circuit in addition to the associated AGC functionality during periods when adjustments are not being made.

To achieve a particular AGC result, the controller 28 does not have to activate all of the AGC units 22, 24, 26 every time. For example, to achieve an increase of 0.5 dB in transmit power, the controller 28 may only decide to activate one of the AGC loops in the transmitter chain (e.g., AGC loop 24) to achieve an increased gain of 0.5 dB. In addition, even when multiple AGC loops are used to achieve a particular result, the loops do not have to be activated in parallel, but may instead be activated sequentially until the desired result has been achieved. In at least one implementation, the controller 28 is programmed to occasionally activate one or more of the AGC loops 22, 24, 26 in order to compensate for drift within the transmitter circuitry.

Figure 3:
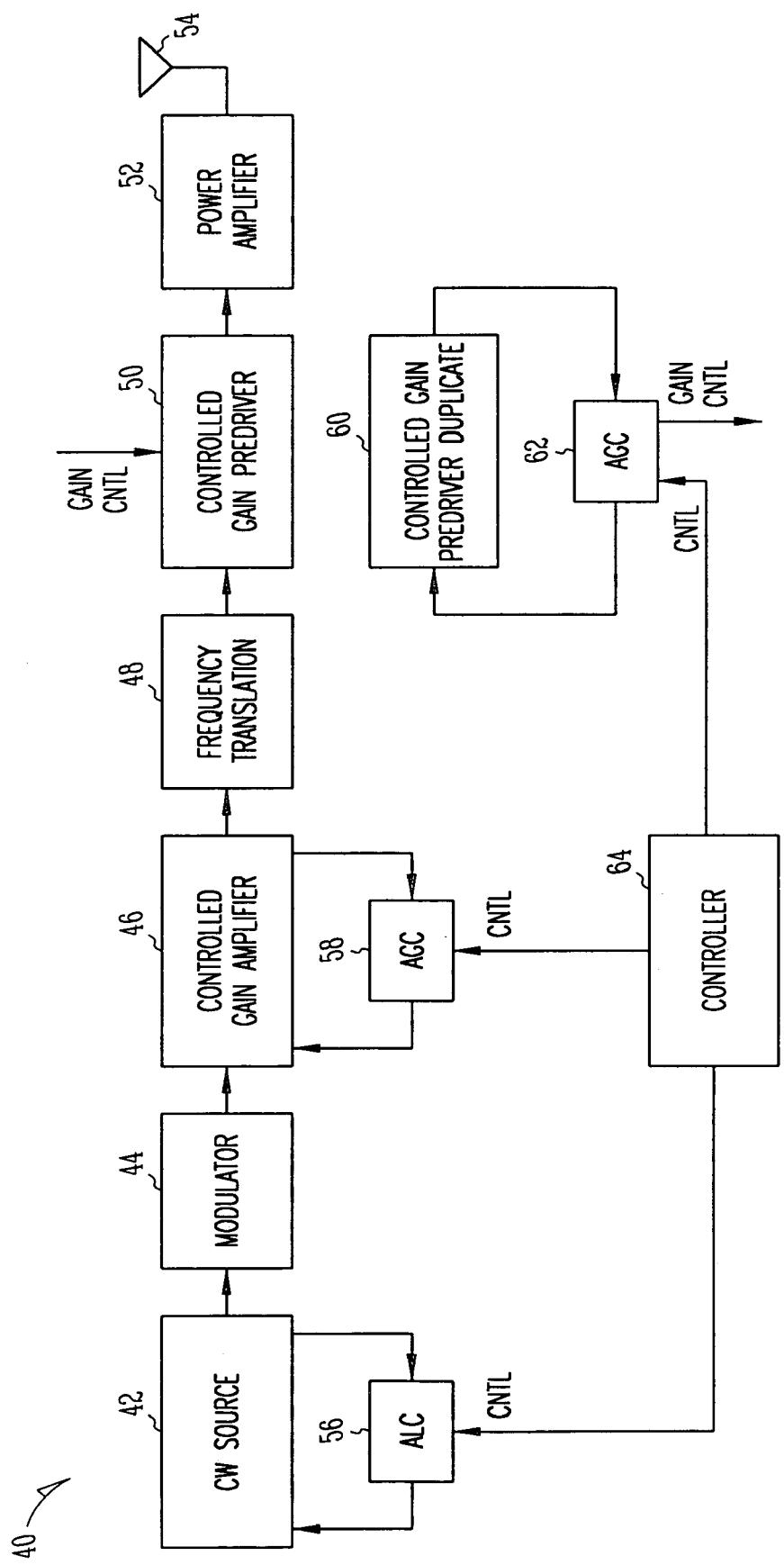
FIG. 3 is a block diagram illustrating a transmitter in accordance with an embodiment of the present invention.

FIG. 3 is a block diagram illustrating a transmitter 40 in accordance with an embodiment of the present invention. As illustrated, the transmitter 40 includes: a CW source 42, a modulator 44, a controlled gain amplifier 46, a frequency translation unit 48, a controlled gain predriver 50, a power amplifier 52, and an antenna 54. The CW source 42 has an associated ALC loop 56 and the controlled gain amplifier 46 has an associated AGC loop 58. In addition, the controlled gain predriver 50 has an associated duplicate circuit 60 with a corresponding AGC loop 62. The transmitter 40 also includes a controller 64 to manage the various loops 56, 58, 62 in the transmitter 40.

During normal operation, the CW source 42 generates a CW carrier signal that is delivered to the modulator 44. The level of the CW carrier signal is controlled by the ALC loop 56. The modulator 44 modulates the carrier signal using transmit data. The controlled gain amplifier 46 amplifies the modulated carrier signal by a gain that is set by AGC loop 58. The frequency translation unit 48 (e.g., a mixer and LO) translates the center frequency of the modulated signal to an appropriate frequency for wireless transmission. If the modulated carrier is already at an appropriate frequency for transmission, the frequency translation unit 48 may be unnecessary. The controlled gain predriver 50 again amplifies the modulated carrier by a gain that is set by AGC loop 62. The power amplifier 52 then amplifies the modulated signal to the transmit power level and delivers the signal to the antenna 54 which transmits the signal into the wireless channel.

The controller 64 will determine settings for the various control loops 56, 58, 62 that are designed to achieve a desired result at the output of the transmitter 40. For example, the controller 64 may determine a desired output level for the CW source 42 and deliver the level information to the ALC loop 56. The ALC loop 56 will then adjust the output level of the source 42 until the desired output level is achieved. The loop 56 may include a detector to directly monitor the output level of the CW source 42. In an alternative embodiment, a fixed level CW source is used. The controller 64 may also determine gain levels for one or both of the controlled gain amplifier 46 and the controlled gain predriver 50 in order to achieve the desired result. This gain information would be delivered to the corresponding AGC loops 58, 60 to adjust the gains of the units 46, 50 accordingly.

The AGC 58 associated with the controlled gain amplifier 46 may utilize any of a variety of different AGC configurations. In one embodiment, for example, a pilot signal AGC approach is used, such as the one illustrated in FIG. 2. A duplicate circuit AGC approach, as well as other AGC techniques, may also be used. In the illustrated embodiment, a duplicate circuit 60 with a corresponding AGC loop 62 is used to control the gain of the controlled gain predriver 50. The controller 64 instructs the AGC loop 62 as to the desired gain of the controlled gain predriver 50. The AGC loop 62 then delivers an input signal to the controlled gain predriver duplicate 60 which amplifies the signal. The AGC loop 62 monitors the output level of the duplicate 60 (using, for example, a detector circuit) and adjusts the gain of the duplicate 60 until the desired gain is achieved. The gain control signal level that resulted in the desired gain in the duplicate 60 is then applied to the actual predriver circuit 50 to achieve the desired gain within the transmitter chain. Because the predriver duplicate 60 is separate from the predriver 50, it is not necessary to use a different frequency within the duplicate 60.

As described above, the controller 64 may be programmed to turn off one or more (or all) of the AGC loops 56, 58, 62 during periods when there is no corresponding adjustment activity. The controller 64 may also be programmed to turn off the controlled gain predriver duplicate 60 during these intervals. In this manner, significant power savings may be achieved. This is particularly beneficial in applications that involve limited sources of power (e.g., battery powered mobile transceivers).

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A transmitter, comprising:
a first variable gain amplifier having a first AGC loop to control a gain thereof;
a second variable gain amplifier having a second AGC loop to control a gain thereof, said second variable gain amplifier being located within a common transmitter chain as said first variable gain amplifier;
at least one of said first AGC loop and said second AGC loop is coupled to a duplicate circuit that mimics the operation of a corresponding variable gain amplifier in the transmitter chain; and
a controller to manage said first AGC loop and said second AGC loop to achieve a desired result at an output of said transmitter.

2. The transmitter of claim 1, comprising:
at least one other variable gain amplifier within the common transmitter chain, said at least one other variable gain amplifier having a corresponding AGC loop, wherein said controller manages said first AGC loop, said second AGC loop, and said AGC loop of said at least one other variable gain amplifier to achieve said desired result.

3. The transmitter of claim 1, comprising:
a CW source having a controllable output level; and
an ALC loop to control said output level of said CW source, wherein said controller manages said ALC loop to achieve said desired result.

4. The transmitter of claim 1, wherein:
at least one of said first AGC loop and said second AGC loop uses a pilot signal to adjust a gain of a corresponding variable gain amplifier, said pilot signal being different from a communication signal propagating through the transmitter chain.

5. The transmitter of claim 1, wherein:
said controller deactivates said first AGC loop during a period when no gain adjustment of said first variable gain amplifier is desired, to reduce power consumption within the transmitter.

6. The transmitter of claim 5, wherein:
said controller deactivates said second AGC loop during a period when no gain adjustment of said second variable gain amplifier is desired, to reduce power consumption within the transmitter.

7. The transmitter of claim 1, wherein:
said first AGC loop is coupled to a duplicate of said first variable gain amplifier, wherein said controller deactivates said duplicate of said first variable gain amplifier during a period when no gain adjustment of said first variable gain amplifier is desired, to reduce power consumption within the transmitter.

8. The transmitter of claim 1, wherein:
said first AGC loop is associated with a pilot generator to generate a pilot signal to be applied to said first variable gain amplifier, wherein said controller deactivates said pilot generator during a period when no gain adjustment of said first variable gain amplifier is desired, to reduce power consumption within the transmitter.

9. The transmitter of claim 1, wherein:
said controller occasionally activates said first AGC loop, when deactivated, to compensate for drift within the transmitter circuitry.

10. A method for generating a transmit signal, comprising:
determining a desired transmit power result for a transmitter;
determining gain values for multiple variable gain amplifiers in the transmitter to achieve the desired transmit power result;
delivering said gain values to AGC loops associated with said multiple variable gain amplifiers, said AGC loops to adjust the gains of said multiple variable gain amplifiers in accordance with said gain values; and
said transmitter includes a first variable gain amplifier and a duplicate of said first variable gain amplifier, wherein said method further comprises deactivating said duplicate of said first variable gain amplifier during an interval when the transmitter is active and no gain adjustment is desired for the first variable gain amplifier.

11. The method of claim 10, wherein:
determining a desired transmit power result includes determining a desired transmit power level.

12. The method of claim 10, wherein:
determining a desired transmit power result includes determining a desired change in transmit power level.

13. The method of claim 10, wherein:
determining desired gains includes determining gains that enhance a dynamic range of said transmitter.

14. The method of claim 10, comprising: deactivating circuitry associated with an AGC loop in the transmitter during an interval when the transmitter is active and no gain adjustment is desired for a corresponding variable gain amplifier.

15. The method of claim 10, wherein:
said transmitter includes a first variable gain amplifier and a duplicate of said first variable gain amplifier, wherein said method further comprises deactivating said duplicate of said first variable gain amplifier during an interval when the transmitter is active and no gain adjustment is desired for the first variable gain amplifier.

16. The method of claim 10, comprising:
determining an output level for a CW source in the transmitter to achieve the desired transmit power result; and
delivering said output level to an ALC loop associated with the CW source, said ALC loop to adjust the output level of the CW source accordingly.

17. A transmitter comprising:
a CW source to generate a carrier signal;
a modulator to modulate said carrier signal based on input data;
a first variable gain amplifier to amplify a signal previously processed by said modulator, said first variable gain amplifier having a first AGC loop to control a gain thereof;
a second variable gain amplifier to amplify a signal previously processed by said first variable gain amplifier, said second variable gain amplifier having a second AGC loop to control a gain thereof;
said first AGC loop and said second AGC loop use duplicate circuits to adjust the gains of corresponding variable gain amplifiers; and
a controller to determine gains for said first and second variable gain amplifiers to achieve a desired result at an output of the transmitter, said controller to deliver said gains to said first and second AGC loops, respectively.

18. The transmitter of claim 17, wherein:
said CW source has an ALC loop associated with it to control an output level thereof, wherein said controller determines an output level for the CW source to achieve the desired result at the output of the transmitter, said controller to deliver said output level to the ALC loop of the CW source.

19. The transmitter of claim 17, comprising:
a frequency translation device between the first and second variable gain amplifiers to translate a frequency of a signal propagating from the first variable gain amplifier to the second variable gain amplifier.

20. The transmitter of claim 17, comprising:
at least one other variable gain amplifier having a corresponding AGC loop, wherein said controller determines gains for said first AGC loop, said second AGC loop, and said AGC loop of said at least one other variable gain amplifier to achieve said desired result.

21. The transmitter of claim 17, wherein:
said first AGC loop uses a pilot signal to adjust the gain of the first variable gain amplifier and said second AGC loop uses a duplicate circuit to adjust the gain of the second variable gain amplifier.

* * * * *